United States Patent [19]
Siegel

[11] Patent Number: 5,424,806
[45] Date of Patent: Jun. 13, 1995

[54] TUBULAR FRAME WITH INTEGRAL AIR DUCT FOR HEAT, DIRT AND OZONE MANAGEMENT

[75] Inventor: Robert P. Siegel, Penfield, N.Y.
[73] Assignee: Xerox Corporation, Stamford, Conn.
[21] Appl. No.: 203,127
[22] Filed: Feb. 28, 1994
[51] Int. Cl.⁶ .................................. G03G 15/00
[52] U.S. Cl. ................................... 355/200; 15/301; 55/385.6; 55/419; 454/49; 355/215
[58] Field of Search .............. 355/215, 30, 200; 15/301; 454/184, 186, 49, 56; 361/831; 174/16.1; 55/385.4, 385.6, 44; 312/265.1, 265.4

[56] References Cited

U.S. PATENT DOCUMENTS

| | | | |
|---|---|---|---|
| 3,298,195 | 1/1967 | Raskhodoff | 174/16.1 X |
| 3,387,648 | 6/1968 | Ward, Jr. et al. | 174/16.1 X |
| 3,396,401 | 8/1968 | Nonomura | 346/76 L |
| 3,662,667 | 5/1972 | Murawski et al. | 174/16.1 X |
| 4,154,521 | 5/1979 | Tanaka | 355/215 |
| 4,522,488 | 6/1985 | Fisher | 355/304 |
| 4,556,890 | 12/1985 | Hermanson | 346/74.4 |
| 5,028,959 | 7/1991 | Gooray | 355/215 |
| 5,073,796 | 12/1991 | Suzuki et al. | 355/215 |

FOREIGN PATENT DOCUMENTS 3-33762  2/1991  Japan.

OTHER PUBLICATIONS

Xerox Disclosure Journal, vol. 17, No. 5, Sep./Oct. 1992, p. 369.

Primary Examiner—A. T. Grimley
Assistant Examiner—Nestor R. Ramirez

[57] ABSTRACT

A system for cleaning the environment of a machine includes the use of a vacuum device connected to tubular frame members which enclose the machine. The tubular frame members serve as air ducts for heat, dirt and ozone management.

7 Claims, 2 Drawing Sheets

TUBULAR FRAME WITH INTEGRAL AIR DUCT FOR HEAT, DIRT AND OZONE MANAGEMENT

BACKGROUND OF THE INVENTION

This invention relates generally to an apparatus that contributes to a failure free copier/printer environment, and more particularly, to the use of tubular frame members for copiers/printers to serve as air ducts for heat, ozone and dirt management and thereby contribute to an environmentally benign or green machine.

Ordinarily, an image is placed onto the surface of a photoconductive member either by illuminating an original document which is projected upon the photoconductive member to produce a latent electrostatic image corresponding to the original document or an image is placed onto the photoconductive member by electronic means. The latent electrostatic image is developed by means of fusible particles to produce a visible toner image which is transferred to a substrate, such as, a copy sheet. The unfused toner image may be fixed to the substrate by means of heat and pressure by pressing the substrate through the nip of a pair of rollers, at least one of which is heated. A fused substrate exiting from the roller nip is in a tacky state having been heated by the heated roller.

It is essential to the maintenance of copy quality and reliability that the machine environment be controlled. Excessive heat can contribute to mechanical failures and cause circuit boards to malfunction. Ozone emission is tightly regulated for health and safety reasons and dirt has been shown to be one of the most significant contributors to machine failures and service actions. Air systems are used in almost all office products as a means of controlling the machine environment. In smaller machines a single blower will generally purge and cool the entire machine with ambient air. In larger machines, several blowers are generally required to service subsystems by the addition or removal of air. For example, in some machines, the area above the fuser is cooled by a high capacity axial fan, but this has a tendency to flutter lightweight sheets. In these machines, duct work is often required to direct the air since it is not always practical to place an air handling device directly at the point of application.

In addition, paper debris (fibers, dust fillers, etc.) contribute significantly to failures in machines. For instance: debris in the paper path fouls sensors, solenoids, and frictional materials; fillers foul fuser oil; and fibers ruin photoreceptor belts. Various solutions to these problems have been tried in the past. For example, U.S. Pat. No. 3,396,401 shows that it is old to use an air pressure system to remove loose toner from the surface of a copy sheet. In U.S. Pat. Nos. 4,522,488 and 4,556,890, vacuum cleaning systems are disclosed that include screens or bristles that contact the printhead or the recording surface of magnetic tape in a magnetographic printing device. A vacuum system in combination with a foam roll to dislodge loose fibers from the surface of copy sheets is disclosed in the Xerox Disclosure Journal, Vol. 17, No. 5, September/October 1992, page 369.

Even though the above above-described machine debris removal systems have been successful to some extent, an improvement is still needed because of the continued presence of unwanted heat, dirt and ozone in machines.

SUMMARY OF THE INVENTION

Accordingly, in an aspect of this invention, a means of cleaning the environment of a machine is disclosed that is both cost effective and space efficient and comprises the use of tubular frame members that house a machine as duct for a heat, ozone and dirt collecting network connected to a centralized blower and filter located at the rear of the machine.

BRIEF DESCRIPTION OF THE DRAWINGS

The foregoing and other features of the instant invention will be apparent from a further reading of the specification, claims and from the drawings in which:

While the present invention will be described hereinafter in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

The invention will now be described by reference to a preferred embodiment of the tubular frame air duct heat, ozone and dirt management system for a copier/printer. However, it should be understood that the air duct management method and apparatus of the present invention could be used with any machine in which removal of heat, ozone or dirt is desired.

In general, an improvement to prior systems of controlling the environment of machines is disclosed which is cost effective and space efficient and comprises the use of tubular frame members for machines to serve as air ducts for heat and dirt management. One or more removable filters are used in the system which would be changed at periodic intervals.

Figure 1:
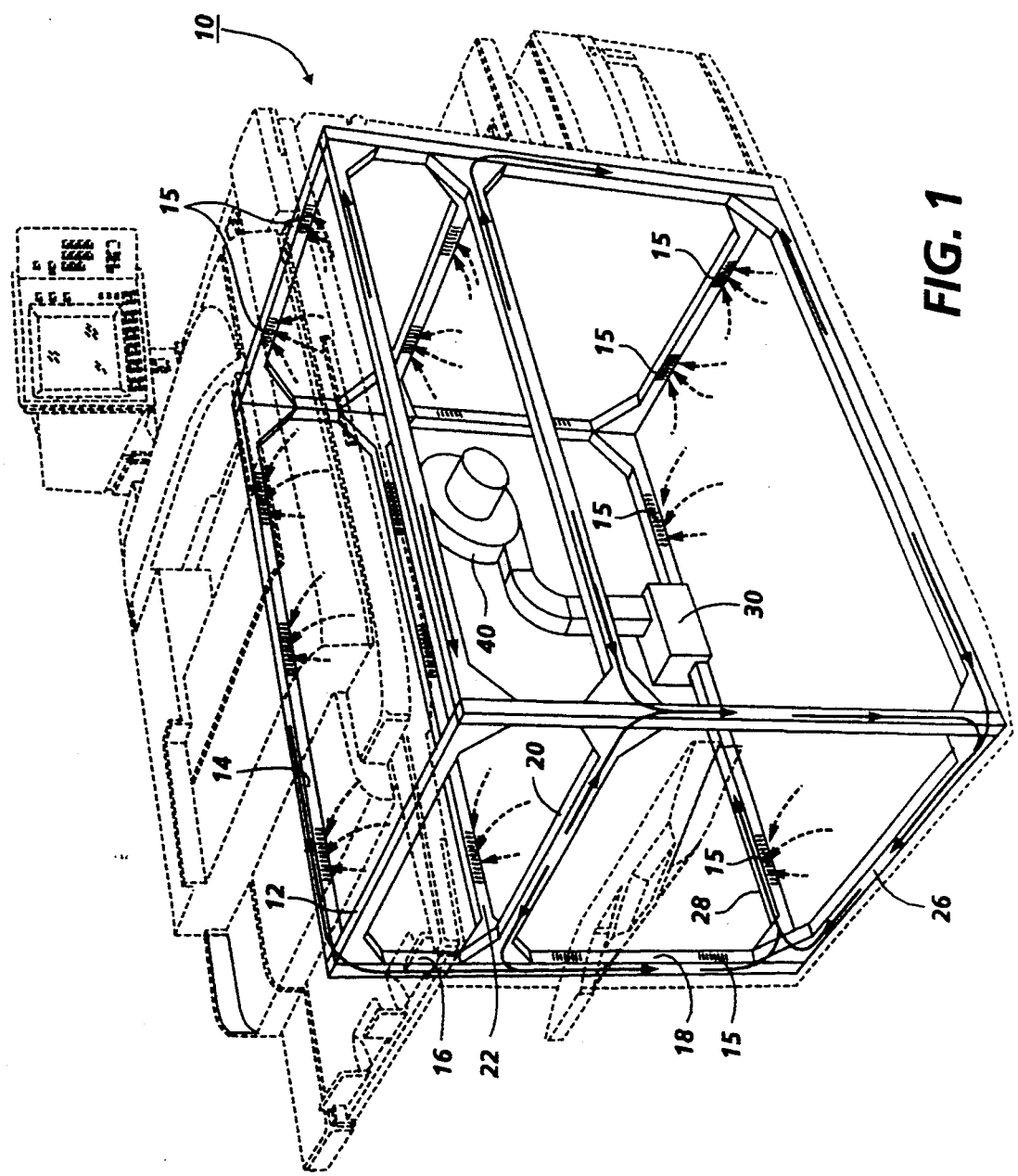
FIG. 1 is an enlarged, partial schematic of a conventional machine in phantom housing a tubular frame with the frame being used as duct in accordance with the present invention.
Figure 2:
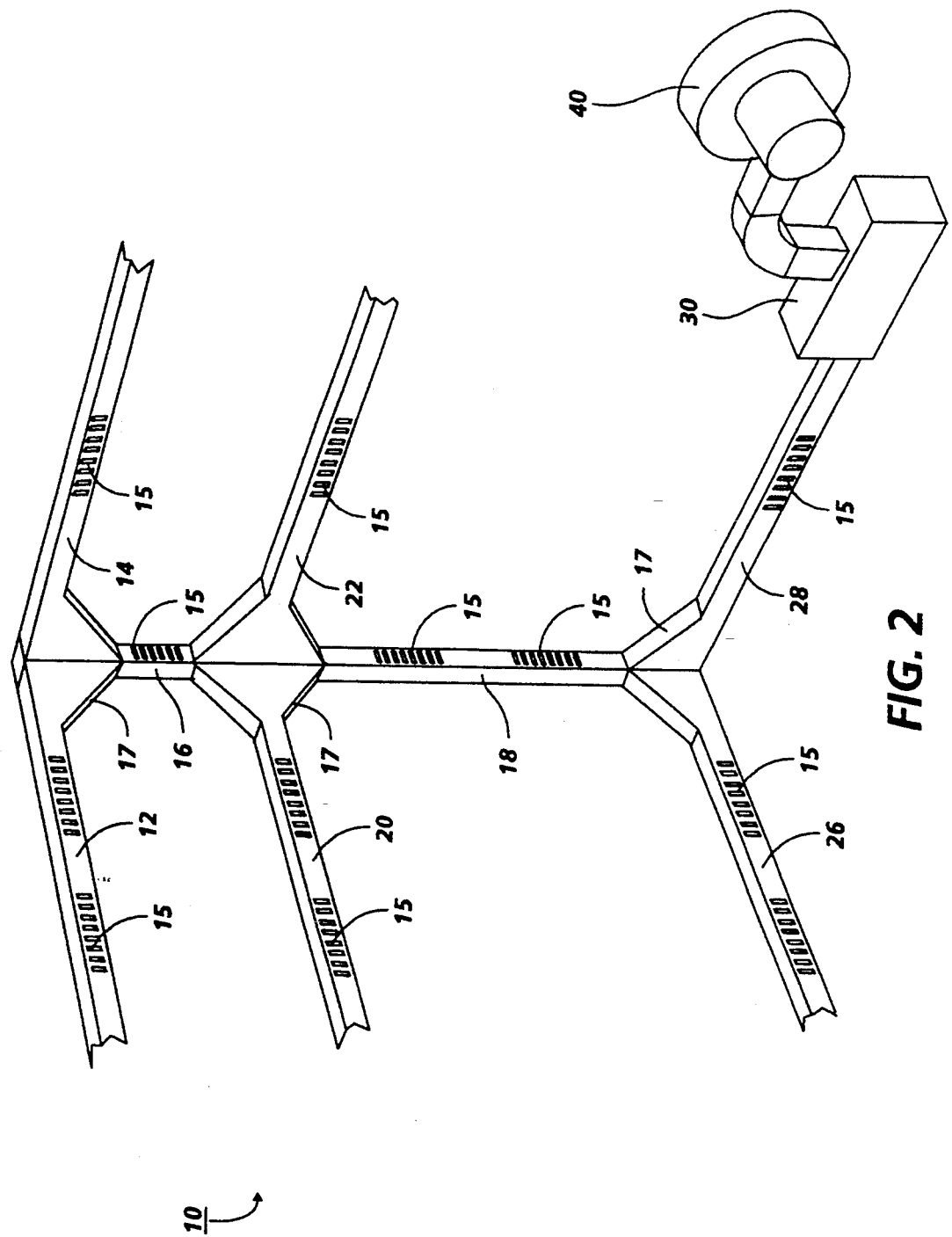
FIG. 2 is an enlarged, partial schematic of the tubular frame members shown in FIG. 1.

Referring now particularly to FIG. 1, there is illustrated an exemplary tubular frame support structure 10 into which the structural components of a conventional xerographic reproduction machine shown in phantom is placed. Tubular frame 10 includes hollow base members 26 and 28 that are connected so as to be orthogonal to each other. Base member 28 has a filter 30 positioned therein upstream from blower 40 which produces a vacuum throughout the duct work of the tubular frame. Air inlets 15 are included in tubular members 26 and 28 in order for operation of vacuum blower to collect contaminants from the machine environment. Since structural and size constraints may dictate the maximum and minimum tubing diameter which can be used in the frame, air flow balancing in the system must be achieved through the design of the inlets. Hence, vertical, upstanding, hollow, tubular member 18 has air inlets 15 therein and supports and connects tubular members 20 and 22 to blower 40. Air inlets 15 are placed in both tubular members 20 and 22. Vertical, hollow, tubular member 16 is connected to upstanding member 18 and supports intersecting hollow, tubular members 12 and 14 which also have air inlets 15 in each to receive, heat, dirt or ozone removed from the machine environment by blower 40. The operating pressure of the system is determined by the run with the maximum continuation of required flow and impedance. All other runs are designed with inlet areas sized to allow the required flow. Chamber members 17, as shown in FIG. 2, are placed at each junction of tubular members 12, 14, 20, 22, 26 and 28 to improve air flow efficiency. The orthogonal horizontal and vertical support members shown in FIG. 1 have complimentary members opposite thereto that form a box-like support enclosure 10 for the machine shown in phantom. Since not all areas of the machine require access to the vacuum system, some of the frame members may have closed ends. Blower 40 can be positioned outside the rear machine panel, if desired.

In conclusion, a heat, dirt and ozone management system has been disclosed that uses tubular frame members as ducts for a heat, dirt and ozone collection through the connection of the tubular members to a centralized blower and filter. This system contributes to the maintenance of copy quality and machine reliability through the control of the machine's environment and thereby enhances cost effectiveness since repair calls are reduced.

It is, therefore, evident that there has been provided in accordance with the present invention a tubular frame apparatus for copiers/printers or the like which serve as air ducts for heat, ozone and dirt management thereby fully satisfying the aims and advantages hereinbefore set forth. While this invention has been described in conjunction with a specific embodiment thereof, it is evident that many alternatives, modifications and variations will be apparent to those skilled in the art. Accordingly, it is intended to embrace all such alternatives, modifications and variations as fall within the spirit and broad scope of the appended claims.

What is claimed is:

1. A dual use system for cleaning the environment of and supporting a machine, comprising:
   connected vertical and horizontal, hollow, tubular, structural, frame members for housing the machine, said hollow, tubular, structural, frame members being separate and enclosed with respect to the housed machine and adapted to support the machine as one use and serve as a conduit for exhaustion of contaminants from the machine as another use;
   air inlets positioned within said frame members;
   chamber members placed at each junction of said frame members to improve air flow efficiency; and
   a negative pressure source connected to said frame members for creating a vacuum pressure within said frame members in order to draw contaminants from the environment of the machine.

2. The system of claim 1, wherein said contaminants include dirt, ozone and heat.

3. The system of claim 2, including a filter positioned between said blower and a tubular member of said frame.

4. A method for cleaning the environment of a machine, comprising the steps of:
   providing a hollow, tubular network of connected vertical and horizontal frame members for housing the machine;
   providing chamber members placed at each junction of said hollow, tubular frame members to improve air flow efficiency.
   providing air inlets positioned within said hollow, tubular frame members; and
   providing a blower connected to said hollow, tubular frame members for creating a vacuum pressure within said hollow, tubular frame members in order to draw contaminants from the environment of the machine.

5. The method of claim 4, including the step of placing a filter between said blower and a tubular member of said frame.

6. In an apparatus that prints page image information onto copy sheets that includes a photoconductive surface, a charge station for placing a charge on the photoconductive surface in imagewise configuration, a development station for developing the image on the photoconductive surface, a transfer station for transferring the developed image from the photoconductive surface to a copy sheet, and a fusing station for receiving the sheet and rendering the developed image permanently affixed to the sheet by application of heat and pressure, the improvement characterized by a system for removing heat, dirt, debris and ozone from the apparatus produced by the paper path and various stations of the apparatus, comprising:
   connected vertical and horizontal, hollow, structural, dual purpose, tubular frame members adapted to house the apparatus, said hollow, structural, tubular frame members being separate and enclosed with respect to the housed apparatus and adapted to support the apparatus as one use and serve as a conduit for exhaustion of contaminants from the apparatus as another use, and wherein chamber members are placed at each junction of said frame members to improve air flow efficiency;
   air inlets positioned within said frame members; and
   a negative pressure source connected to said frame members for creating a vacuum pressure within said frame members in order to draw heat, dirt, debris and ozone from the environment of the apparatus.

7. The improvement of claim 6, including a filter positioned between said blower and a tubular member of said frame.

* * * * *